United States Patent
Baek

(10) Patent No.: US 6,329,887 B1
(45) Date of Patent: Dec. 11, 2001

(54) SURFACE ACOUSTIC WAVE FILTER PACKAGE

(75) Inventor: Kwang Hyun Baek, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/357,929

(22) Filed: Jul. 21, 1999

(30) Foreign Application Priority Data

Jul. 24, 1998 (KR) .................................................. 98-29937

(51) Int. Cl.[7] .............................. H03H 9/10; H03H 9/64
(52) U.S. Cl. ....................... 333/193; 333/150; 310/313 R
(58) Field of Search ..................................... 333/150–155, 333/193–196; 310/313 R, 313 B, 313 C, 313 D

(56) References Cited

U.S. PATENT DOCUMENTS

| | | | |
|---|---|---|---|
| 4,126,839 | * | 11/1978 | Yamanoi et al. ..................... 333/194 |
| 4,365,219 | * | 12/1982 | Nathan .................................. 333/193 |
| 4,409,567 | * | 10/1983 | Setsune et al. ................... 333/194 X |
| 4,500,807 | * | 2/1985 | Yuhara et al. ..................... 310/313 B |
| 5,237,235 | * | 8/1993 | Cho et al. ......................... 310/313 R |
| 5,281,883 | * | 1/1994 | Ikata et al. .................... 310/313 B X |

FOREIGN PATENT DOCUMENTS

| | | | |
|---|---|---|---|
| 6-97757 | * | 4/1994 | (JP) ...................................... 333/193 |
| 11-88109 | * | 3/1999 | (JP) . |

* cited by examiner

Primary Examiner—Robert Pascal
Assistant Examiner—Barbara Summons
(74) Attorney, Agent, or Firm—Fleshner & Kim, LLP

(57) ABSTRACT

SAW filter package which can reduce an electromagnetic feed-through for improving an SAW filter performance including a base having a frame around a periphery, a ground part formed of a metal plating on an inside surface of the base for attaching an acoustic surface wave filter thereto, cut-away portions formed by cutting the metal plating of the ground part in two steps, and a metal piece electrically separated from the metal plating by the cut-away portions.

14 Claims, 7 Drawing Sheets

SURFACE ACOUSTIC WAVE FILTER PACKAGE

BACKGROUND OF THE INVENTION

1. Field of the Invention

The present invention relates to an SAW(Surface Acoustic Wave) filter package, and more particularly, to an SAW filter package which can reduce an electromagnetic feed-through for improving an SAW filter performance.

2. Background of the Related Art

Being a filter of a piezoelectric material, the SAW filter is widely used as an intermediate frequency filter because the SAW filter permits multipoint drive and reception, has excellent earthquake and impact resistances as being supported from a substrate, and permits independent control of amplitude and phase, and has an excellent filter performance.

Referring to FIG. 1, a related art SAW filter is provided with an input terminal IDT (Inter-Digital Transducer) 12 for providing an input signal Vs with an impedance Rs, an output terminal IDT 13 connected to an output impedance $R_0$, and absorber 14 for absorbing a reflected wave.

Shown in FIG. 2 are details of the input terminal IDT 12 and the output terminal IDT 13, both are of a withdrawal weighting type, respectively having one side with an input port 15 and the other side with a ground terminal 17, and one side with a ground terminal 17 and the other side with an output port 16. And, there is a slightly tilted blocking bar 18 disposed between the input terminal IDT 12 and the output terminal IDT 13 having both ends connected to the ground terminal 17 for reducing the electromagnetic feed-through.

FIGS. 3A~3D illustrate details of a general SMD(Surface Mounted Device) package for mounting the SAW filter, wherein FIG. 3A illustrates a back of the package, FIG. 3B illustrates a side of the package, FIG. 3C illustrates a plan view of the package with a cover closed, and FIG. 3D illustrates a plan view of the package with a cover opened.

Referring to FIGS. 3A~3D, an SMD package is provided with a base 20 of ceramic, a metal plated frame 21 projected vertical from the base 20 along a periphery of the base 20, a plurality of gold plated pads 22 formed in sides of the base 20, a ground terminal 23 of a gold plating formed on an inside surface of the base 20, and a cover 24 for sealing the mounted filter. And, the SAW filter is mounted on the ground terminal 23 of the SMD package. The reference numeral 25 is a pad connection terminal.

Upon application of a high frequency electric field to the input terminal IDT 12, a surface acoustic wave is excited by a piezoelectric action in the related art SAW filter, transmitted to the output terminal IDT 13 through a surface of the piezoelectric material 11, and converted into the high frequency electric field again by a reverse piezoelectric action, to generate an electric signal. When the surface acoustic wave, generated upon application of a high frequency electric field to the input terminal IDT 12, is transmitted through surface of the piezoelectric material 11, there is an electromagnetic feed-through directly transmitted from the input terminal IDT 12 to the output terminal IDT 13 in a form of electric or emissive energy. This is caused by the close proximity of the input terminal IDT 12 and the output terminal IDT 13, which is increased as the applied frequency is increased and makes interference with the surface acoustic wave to deteriorate an SAW filter performance because the electromagnetic feed-through is transmitted at a speed of light different from an energy carried by the surface acoustic wave that is the basic operation principle of the SAW filter.

The electromagnetic feed-through is caused by the following major two reasons.

The first one is that, as in general upper and lower surfaces of the package are formed of conductive material and the piezoelectric material of the SAW filter is a ferroelectric material, the package with the SAW filter mounted thereon forms a dielectric waveguide because a ferroelectric material present between the input/output terminal IDTs, which are formed on surfaces of the piezoelectric material, and the package. In this instance, even though a wave fed through a dielectric waveguide is leaky, an energy transmitted by the electromagnetic feedthrough is relatively great in comparison to other secondary effect because the input terminal IDT and the output terminal IDT are at a close proximity.

Another one is that emission occurs between the input/output terminal IDTs and bonding wires. Since the input/output terminal IDTs and the bonding wires actually act as antennas, they emits electromagnetic waves within the SAW filter package, causing the electromagnetic feed-through. As shown in FIG. 2, in the related art, in order to reduce the electromagnetic feed-through, the metallic conductive blocking bar 18 is placed on the surface of the piezoelectric material 11 between the input terminal IDT 12 and the output terminal IDT 13, with the bar 18 tilted at a given angle and both ends of the bar 18 grounded. This configuration can reduce the electromagnetic feed-through because the electromagnetic feed-through from the input terminal IDT 12 to the output terminal IDT 13 through the surface of the piezoelectric material 11 is absorbed by the blocking bar 18 and discharged through the ground terminals at both ends thereof.

However, as there is only the blocking bar provided in the related art SAW filter package, the related art SAW filter package can not but remove a portion of the electromagnetic feed-through flowing through the surface of the piezoelectric material, allowing the other portion to cause interference with the surface acoustic wave, that deteriorates the filter performance.

SUMMARY OF THE INVENTION

Accordingly, the present invention is directed to an SAW filter package that substantially obviates one or more of the problems due to limitations and disadvantages of the related art.

An object of the present invention is to provide an SAW filter package which can improve an SAW filter package performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the SAW filter package includes a base having a frame around a periphery, a ground part formed of a metal plating on an inside surface of the base for attaching an acoustic surface wave filter thereto, cut-away portions formed by cutting the metal plating of the ground part in two places, and a metal piece electrically separated from the metal plating by the cut-away portions.

In a case of the SAW filter package of the present invention which is provided with the two cut-away portions and the center grounded metal piece in the ground portion, the negative current at the output terminal is very weak because the negative current generated at the input terminal is, not only blocked by the cut-away portions to be reduced significantly, but also becomes very weak at the output terminal even if a weak negative current passes through the cutaway portion by the waveguide effect as the weak negative current is drained to the ground, thereby significantly reducing an unwanted electromagnetic feed-through.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 4A:
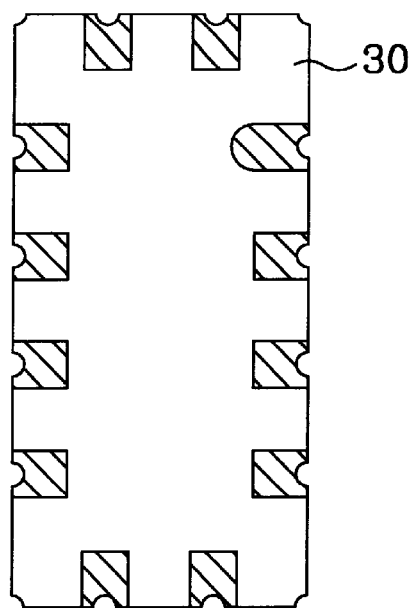
FIGS. 4A~4D illustrate details of an SAW filter package structure in accordance with a preferred embodiment of the present invention; and, FIGS. 5A and 5B illustrate negative current flows in lower surfaces of the related art SAW filter package structure and the SAW filter package structure of the present invention, respectively.
Figure 4B:
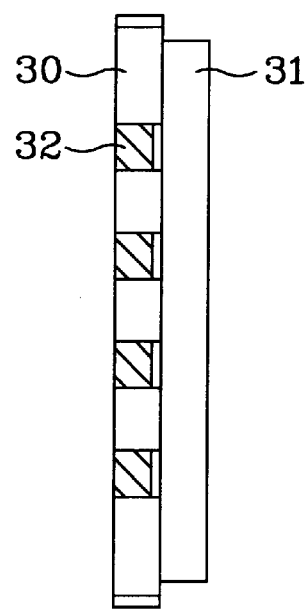
Figure 4C:
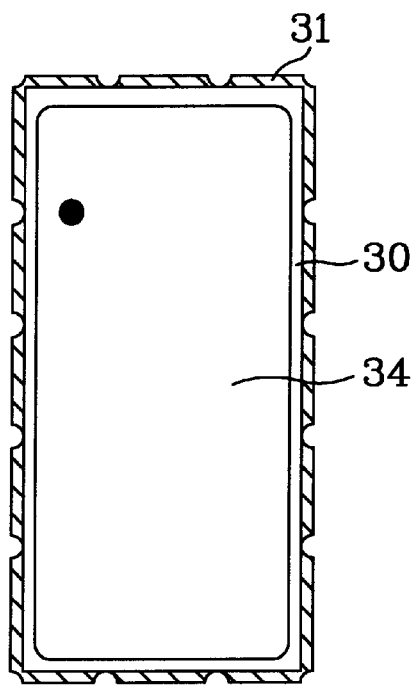
Figure 4D:
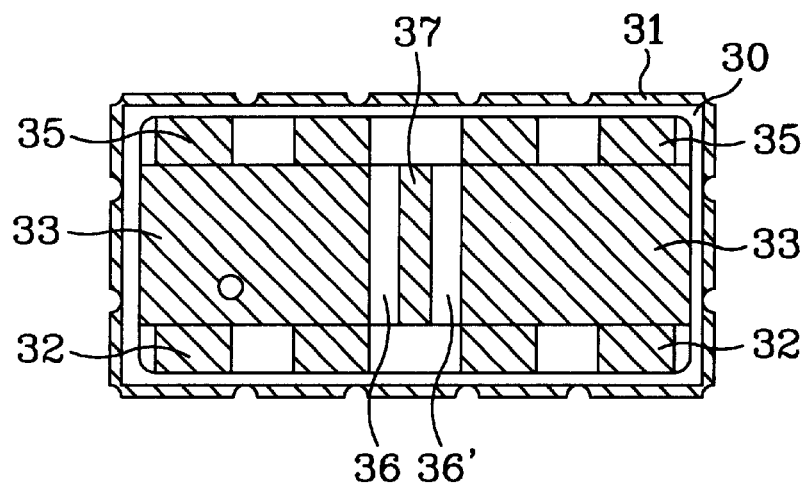

Reference will now be made in detail to the preferred embodiments of the present invention, examples of which are illustrated in the accompanying drawings. FIGS. 4A~4D schematically illustrate details of an SAW filter package structure in accordance with a preferred embodiment of the present invention, wherein FIG. 4A illustrates a back of the package, FIG. 4B illustrates a side of the package, FIG. 4C illustrates a plan view of the package, and FIG. 4D illustrates a plan view of the package with a cover opened without the SAW filter mounted thereon.

Figure 1:
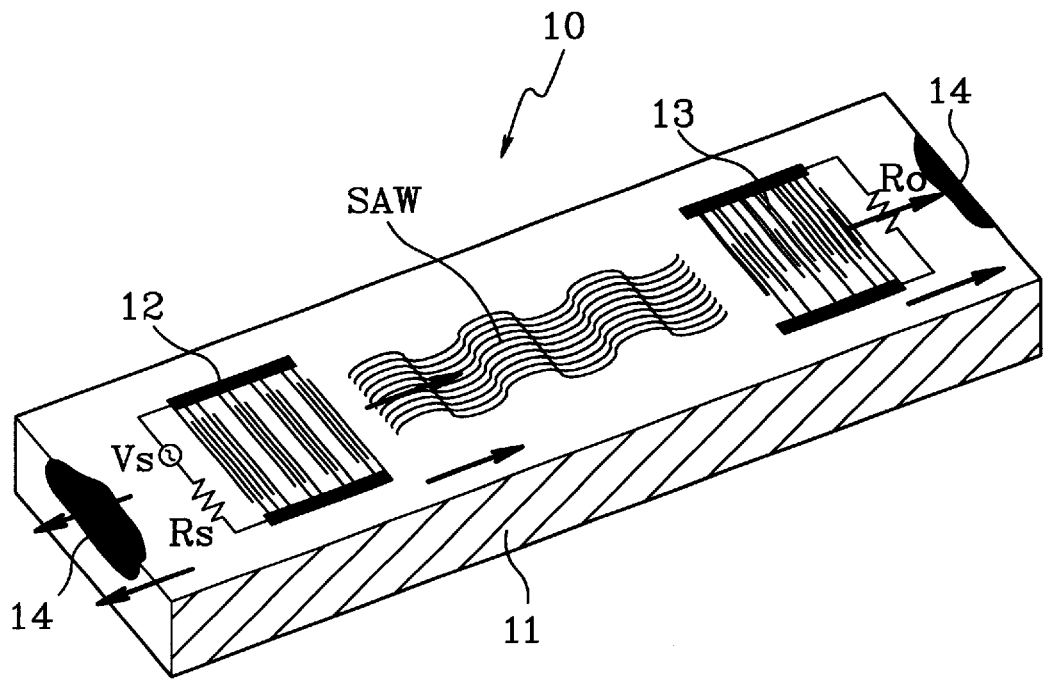
FIG. 1 illustrates a related art surface acoustic wave filter, schematically.
Figure 2:
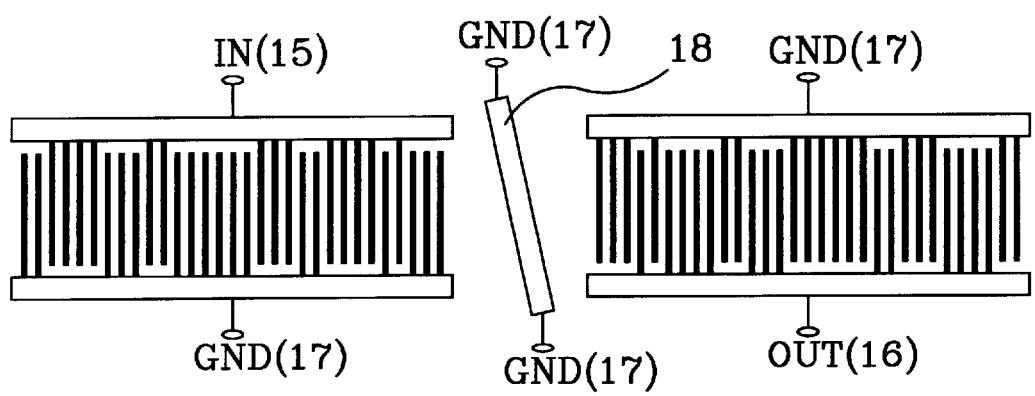
FIG. 2 illustrates details of an input terminal IDT and an output terminal IDT on the related art SAW filter.
Figure 3A:
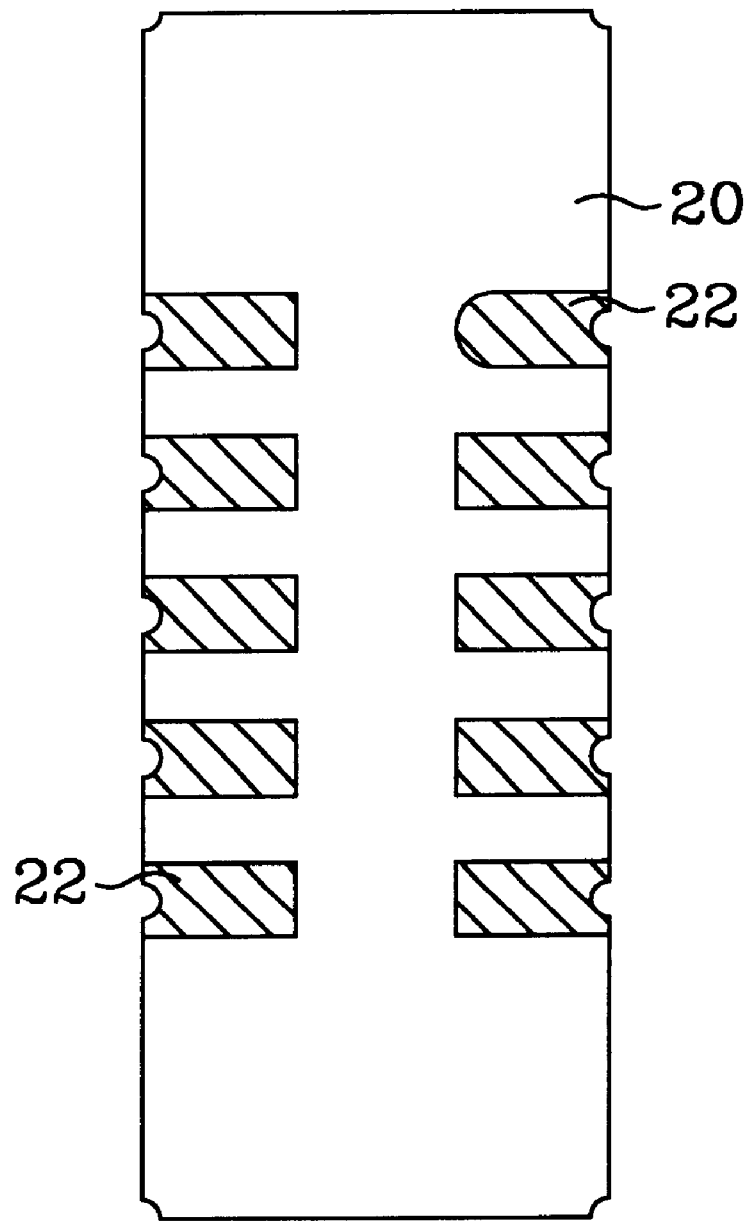
FIGS. 3A~3D illustrate details of a related art SAW filter package structure.
Figure 3B:
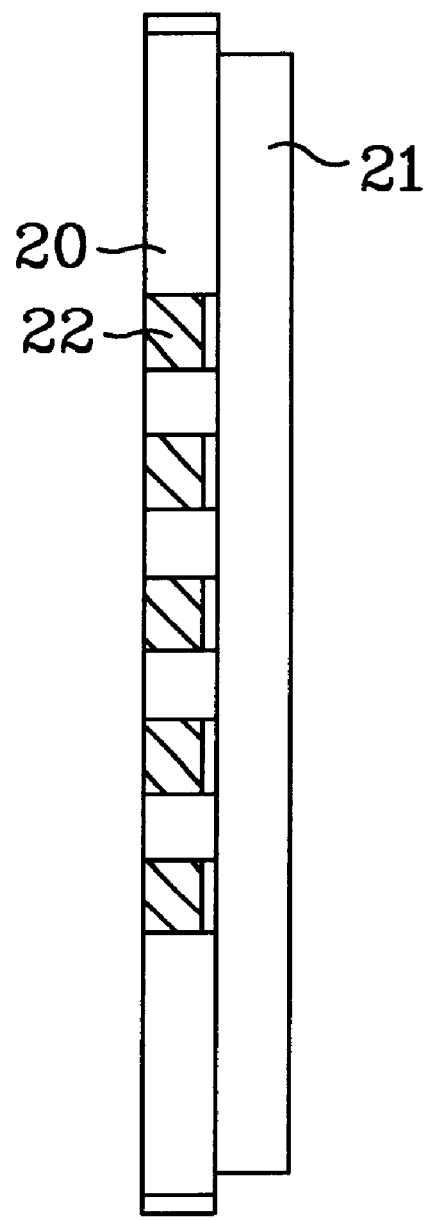
Figure 3C:
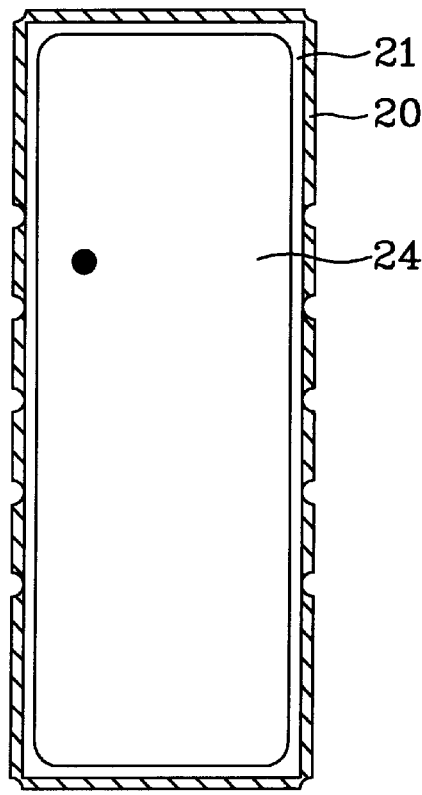
Figure 3D:
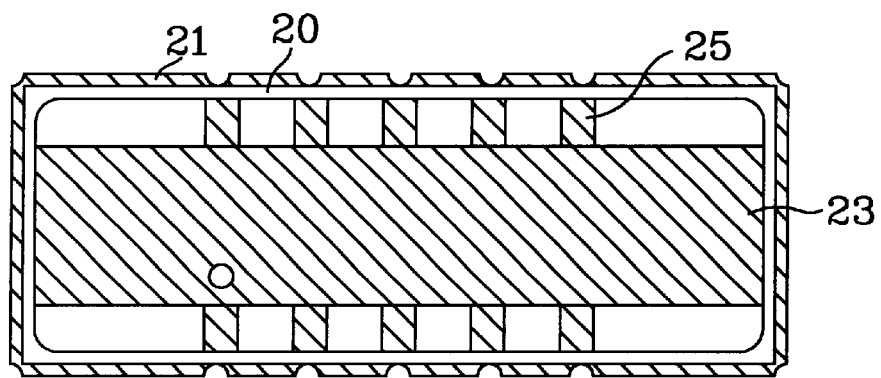

Referring to FIGS. 4A~4D, the SAW filter package in accordance with a preferred embodiment of the present invention includes a base 30 of dielectric, such as ceramic, a frame 31 plated with a metal, such as gold, and projected vertical from the base 30 along a periphery of the base 30, a plurality of metal pads 32 in sides of the base 30 for grounding and signal connection, a ground part 33 of a metal plating on an inside surface of the base 30 having an SAW filter(not shown) attached thereto, pad connections 35 for connecting the ground part 33 to the pads 32 in sides of the base 30, and a cover 34 for sealing the SAW filter. The metal plating of the ground part 33 is provided with two cut-away parts 36 and 36' for electric separation of the ground part 33 at a position corresponding to a position at which the blocking bar 18(see FIG. 2) is mounted between the input terminal IDT 12 and the output terminal IDT 13 in the related art SAW filter, preferably leaving a metal piece 37 at a center between the two cut-away portions 36 and 36' for more effective reduction of the electromagnetic feed-through provided that the metal piece 37 is grounded. And, by attaching the SAW filter 10 on a surface of the ground part 33 and covering the SAW filter 10 with the cover 34, packing of the SAW filter is completed. In the SAW filter package of the present invention, because not only the blocking bar 18 absorbs the electromagnetic feed-through in the middle of transmission from the input terminal IDT 12 to the output terminal IDT 13, but also the cut-away portions 36 and 36' and the grounded metal piece 37, both are formed beneath the blocking bar 18, for two step electrical separation of the metal plating of the ground part 18, which forms a portion of the waveguide, breaks the dielectric waveguide structure formed by the SAW filter package and the piezoelectric material of the SAW filter, not only the electromagnetic feed-through, an electromagnetic wave energy generated at the input terminal IDT 12, is not transmitted to the output terminal IDT 13, but also the electromagnetic feed-through is blocked by the grounded center metal piece 37 even if a weak electromagnetic feed-through is emitted along the dielectric waveguide. That is, the electromagnetic feed-through generated at an upper portion of the SAW filter is blocked by the blocking bar on the piezoelectric material and the electromagnetic feed-through generated at a lower portion of the piezoelectric material is blocked by the package of the present invention.

Figure 5A:
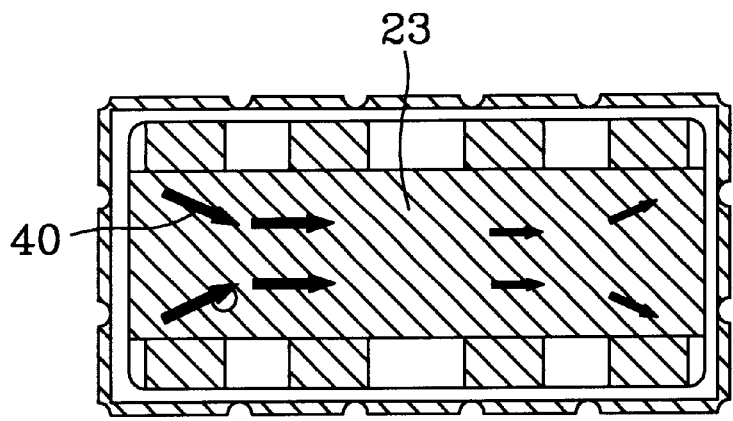

FIGS. 5A and 5D illustrate negative current flows in lower surfaces of the related art SAW filter package structure and the SAW filter package structure of the present invention, respectively.

Figure 5B:
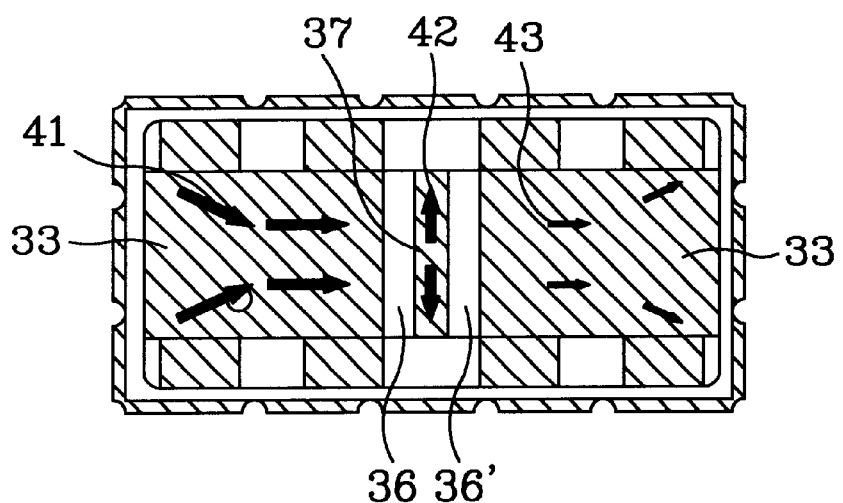

The unwanted negative current in the lower surface, which corresponds to the electromagnetic feed-through, lessens the reduction effect at the blocking region. As shown in FIG. 5A, in the case of the related art, very great negative current 40 generated at the input terminal flows toward the output terminal. However, as shown in FIG. 5B, in a case of the SAW filter package of the present invention which is provided with the two cut-away portions 36 and 36' the center grounded metal piece 37 in the ground portion 33, the negative current 43 at the output terminal is very weak because the negative current 41 generated at the input terminal is, not only blocked by the cut-away portions 36 and 36' to be reduced significantly, but also becomes very weak at the output terminal even if a weak negative current 42 passes through the cut-away portion 36 by the waveguide effect as the weak negative current 42 is drained to the ground. Thus, the unwanted electromagnetic feed-through can be removed, significantly.

As has been explained, the SAW filter package of the present invention can reduce the electromagnetic feed-through, permitting a greater reduction at a filter stop band and reduces ripples in a pass band, whereby providing an SAW filter of an excellent performance.

It will be apparent to those skilled in the art that various modifications and variations can be made in the SAW filter package of the present invention without departing from the spirit or scope of the invention. Thus, it is intended that the present invention cover the modifications and variations of this invention provided they come within the scope of the appended claims and their equivalents.

What is claimed is:

1. An acoustic surface wave filter package comprising:
   a base having a frame around a periphery;
   a ground part formed of a metal plating on an inside surface of the base for attaching an acoustic surface wave filter thereto;
   cut-away portions formed by cutting the metal plating of the ground part in two places wherein the cut-away portions are positioned opposite to a blocking bar in a surface acoustic wave (SAW) filter; and a metal piece electrically separated from the metal plating by the cut-away portions.

2. The package as claimed in claim 1, wherein the metal piece is grounded.

3. The package as claimed in claim 1, wherein the acoustic surface wave filter includes an input terminal IDT, an output terminal IDT, an absorber, and a blocking bar.

4. The package as claimed in claim 1, wherein the cut-away portions and the metal piece block electromagnetic feed-through at a lower portion of the SAW filter.

5. The package as claimed in claim 1, wherein the metal plating and the cut-away portions correspond to a position at which the blocking bar is mounted between an input terminal IDT and an output terminal IDT in a SAW filter.

6. An acoustic surface wave filter packaging comprising:

a base having a frame around a periphery;

a ground part formed of a metal plating on an inside surface of the base for attaching an acoustic surface wave filter thereto;

cut-away portions formed by cutting the metal plating of the ground part in two places wherein the cut-away portions are positioned opposite to a blocking bar in a surface acoustic wave (SAW) filter; and a metal piece electrically separated from the metal plating by the cut-away portions, wherein the metal piece is positioned opposite to a blocking bar in a surface acoustic wave (SAW) filter.

7. The package as claimed in claim 6, wherein the metal piece is grounded.

8. The package as claimed in claim 6, wherein the acoustic surface wave filter includes an input terminal IDT, an output terminal IDT, an absorber, and a blocking bar.

9. The package as claimed in claim 6, wherein the cut-away portions and the metal piece block electromagnetic feed-through at a lower portion of the SAW filter.

10. A surface acoustic wave (SAW) filter package comprising:

a base of dielectric with a vertical projection along a periphery of the base;

a plurality of metal pads on sides of the base;

a ground part of a metal plating on an inside surface of the base with a SAW filter attached thereto, wherein the metal plating has cut-away portions which leave a metal piece for reduction of electromagnetic feed-through provided that the metal piece is grounded; and a cover for sealing the SAW filter, wherein the cut-away parts correspond to a position at which a blocking bar of the SAW filter is mounted.

11. The package as claimed in claim 10, wherein the cut-away parts correspond to a position between an input terminal IDT and an output terminal IDT in the SAW filter attached thereto.

12. The package as claimed in claim 10, wherein the metal piece corresponds to a position at which a blocking bar of the SAW filter is mounted.

13. A surface acoustic wave (SAW) filter package comprising:

a base of dielectric with a vertical projection along a periphery of the base;

a plurality of metal pads on sides of the base;

a ground part of a metal plating on an inside surface of the base with a SAW filter attached thereto, wherein the metal plating has cut-away portions which leave a metal piece for reduction of electromagnetic feed-through provided that the metal piece is grounded; and a cover for sealing the SAW filter, wherein the metal piece corresponds to a position at which a blocking bar of the SAW filter is mounted.

14. The package as claimed in claim 13, wherein the cut-away parts correspond to a position between an input terminal IDT and an output terminal IDT in the SAW filter attached thereto.

* * * * *